US008685780B2

(12) United States Patent
Kim et al.

(10) Patent No.: US 8,685,780 B2
(45) Date of Patent: Apr. 1, 2014

(54) METHOD FOR MANUFACTURING FLEXIBLE ORGANIC THIN FILM SOLAR CELL BY ION BEAM TREATMENT AND SOLAR CELL MANUFACTURED BY THE SAME

(75) Inventors: Won Jung Kim, Gyeonggi-do (KR); Yong Jun Jang, Gyeonggi-do (KR); Yong Gu Kim, Gyeonggi-do (KR); Ki Chun Lee, Seoul (KR); Sang Hak Kim, Gyeonggo-do (KR); Mi Yeon Song, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 691 days.

(21) Appl. No.: 12/852,944

(22) Filed: Aug. 9, 2010

(65) Prior Publication Data
US 2011/0259412 A1 Oct. 27, 2011

(30) Foreign Application Priority Data

Apr. 27, 2010 (KR) ........................ 10-2010-0039228

(51) Int. Cl.
H01L 21/00 (2006.01)
H01L 31/00 (2006.01)
(52) U.S. Cl.
USPC ............. 438/82; 438/48; 438/57; 136/243; 136/252; 257/E51.014; 257/E51.027
(58) Field of Classification Search
None
See application file for complete search history.

(56) References Cited

U.S. PATENT DOCUMENTS

2009/0032107 A1\* 2/2009 Kim et al. ............... 136/263
2009/0056810 A1\* 3/2009 Marks et al. ............ 136/263

FOREIGN PATENT DOCUMENTS

| JP | 2009-032781 A | 2/2009 |
|---|---|---|
| KR | 10-2003-0067175 | 8/2003 |
| KR | 10-2007-0078530 | 8/2007 |
| KR | 10-2008-0045322 | 5/2008 |
| KR | 10-2008-0100057 | 11/2008 |
| KR | 10-2010-0016892 | 2/2010 |
| KR | 10-2010-0018138 | 2/2010 |
| KR | 10-2010-0019722 | 2/2010 |
| KR | 10-2010-0027016 | 3/2010 |

OTHER PUBLICATIONS

Javier Munoz-Garcia, Lecture Notes in Nanoscale Science and Technology (2009), Springer, vol. 5: Toward Functional Nanomaterials, p. 323-399.*

\* cited by examiner

*Primary Examiner* — Julio J Maldonado
*Assistant Examiner* — Joseph Galvin, III
(74) *Attorney, Agent, or Firm* — Edwards Wildman Palmer LLP; Peter F. Corless

(57) ABSTRACT

The present invention provides a method for an organic thin film solar cell and an organic thin film solar cell manufactured by the same, which can reduce manufacturing cost by simplifying manufacturing process, ensure long-lasting durability and stability, and improve energy conversion efficiency of the solar cell. In certain preferred aspects, the present invention provides a method for manufacturing an organic thin film solar cell by ion beam treatment, the method including: forming a nanopattern having a concavo-convex structure by irradiating an ion beam onto the surface of a flexible plastic film substrate; and sequentially stacking a bottom electrode layer, a photoactive layer for photoelectric conversion, and a top electrode layer, which have a nanoscale thickness, on the nanopattern of the substrate such that an electron donor and an electron acceptor in the photoactive layer, where electrons and holes are separated, form a nanopattern by the concavo-convex structure of the substrate, thus forming a bulk heterojunction structure.

15 Claims, 2 Drawing Sheets

METHOD FOR MANUFACTURING FLEXIBLE ORGANIC THIN FILM SOLAR CELL BY ION BEAM TREATMENT AND SOLAR CELL MANUFACTURED BY THE SAME

CROSS-REFERENCE TO RELATED APPLICATION

This application claims under 35 U.S.C. §119(a) the benefit of Korean Patent Application No. 10-2010-0039228 filed Apr. 27, 2010, the entire contents of which are incorporated herein by reference.

BACKGROUND (a) Technical Field

The present invention relates in general to a solar cell. More particularly, it relates to an organic thin film solar cell manufactured by stacking a transparent electrode layer, a photoactive layer, and a metal electrode layer on a substrate, and a method for manufacturing the same.

(b) Background Art

Recently, as global warming becomes more of an issue, technology for using environmentally-friendly energy has attracted much attention. An attractive field, in particular, is solar cells using new and renewable energy.

Examples of such solar cells include silicon-based solar cells, thin film solar cells using inorganic substances such as copper indium gallium selenide (CIGS, $Cu(InGa)Se_2$), dye-sensitized solar cells, organic solar cells, organic-inorganic hybrid solar cells, and the like.

Among them, the organic thin film solar cells, which are inexpensive and have a wide application range, have attracted attention in the field of clothing as well as in the fields of architecture and electronics.

Like the dye-sensitized solar cells, the organic thin film solar cell has a solar cell system which absorbs visible light and produces electricity by a photoelectric conversion mechanism.

However, the dye-sensitized solar cell has certain disadvantages in that it uses expensive rare metals such as ruthenium and its manufacturing process is complicated. On the other hand, the organic thin film solar cell has certain advantages in that its manufacturing cost is low since it is formed of inexpensive polymeric dye synthesized using organic substances extracted from petroleum and it can be manufactured using roll-to-roll equipment used in a typical film formation process.

Typically, the organic thin film solar cell is manufactured by forming a thin film coating layer by spin coating, spray coating, or roll-to-roll process. Moreover, a nanoscale bulk-heterojunction structure is formed to suitably improve the photoactivity using the above processes. This structure allows electrons and holes generated by photons to be efficiently separated, which increases energy conversion efficiency.

However, the bulk heterojunction structure with a nanopattern may be broken by phase separation, which easily occurs at a high temperature (e.g., above 100° C.) and, as a result, the energy conversion efficiency is considerably reduced, which is a problem in terms of long-term durability. In order to solve these problems, a study on the implementation of a fixed physical pattern has been carried out.

Recently, while research on the fabrication of nanopattern using a semiconductor process has been conducted, it takes a considerable amount of time to fabricate the nanopattern due to a large number of processes and it also requires expensive equipment.

Accordingly, there is a need in the art for a method for manufacturing an organic thin film solar cell by a simpler process.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The present invention provides a method for manufacturing an organic thin film solar cell by a simpler process, for example instead of a semiconductor process such as an etching process, a lithography process, and the like, which require high cost, and thus the present invention reduces the manufacturing costs.

According to preferred embodiments, the present invention provides an organic thin film solar cell and a method for manufacturing the same, which can suitably maintain a nanostructure much longer than a bulk heterojunction structure manufactured using a conventional solution process, thus ensuring long-lasting durability and stability.

According to further preferred embodiments, the present invention provides an organic thin film solar cell and a method for manufacturing the same, which can suitably improve energy conversion efficiency by efficiently transferring a considerable amount of photo charges generated by a bulk heterojunction structure to each electrode.

In another preferred embodiment, the present invention provides a method for manufacturing an organic thin film solar cell by ion beam treatment, the method preferably including forming a nanopattern having a concavo-convex structure by suitably irradiating an ion beam onto the surface of a flexible plastic film substrate; and sequentially stacking a bottom electrode layer, a photoactive layer for photoelectric conversion, and a top electrode layer, which have a nanoscale thickness, on the nanopattern of the substrate such that an electron donor and an electron acceptor in the photoactive layer, where electrons and holes are suitably separated, form a nanopattern by the concavo-convex structure of the substrate, thus forming a bulk heterojunction structure.

In a preferred embodiment, the substrate may be formed of a material selected from the group consisting of polyethylene terephthalate (PET), polyethylene naphthalate (PEN), polycarbonate (PC), polymethylmethacrylate (PMMA), polyvinyl alcohol (PVA), polyacetylcellulose (PAC), polyethylene (PE), polyetheretherketone (PEEK), polyethyleneimine (PEI), polyimide (PI), polyacrylate (PA), polyethersulfone (PES), and cyclic olefin copolymer (COC).

In another preferred embodiment, the intensity of the ion beam may be set by adjusting the magnitude of accelerating voltage of focused ion beam in the range of 100 eV to 100 keV.

In still another preferred embodiment, the ion beam irradiation time may be in the range of 1 to 180 min.

In yet another preferred embodiment, the ion beam may include at least one selected from the group consisting of argon, nitrogen, oxygen, helium, and a mixture thereof.

In still yet another preferred embodiment, the photoactive layer may be formed by spin coating, inkjet coating, screen printing, pad printing, or roll-to-roll printing.

In a further preferred embodiment, the bottom electrode layer may be a transparent electrode layer as a positive electrode, the top electrode layer may be a metal electrode layer as a negative electrode, and a hole transport layer formed of a conductive polymer may be interposed between the transparent electrode layer and the photoactive layer.

In another further preferred embodiment the hole transport layer may be formed by spin coating, inkjet coating, screen printing, pad printing, or roll-to-roll printing.

In another aspect, the present invention provides an organic thin film solar cell manufactured by the above method, the organic thin film solar cell preferably including a flexible plastic film substrate including a nanopattern having a concavo-convex structure and formed on the surface thereof; a top electrode and a bottom electrode, stacked on the top of the substrate; and a photoactive layer interposed between the top electrode and the bottom electrode and including a bulk heterojunction structure between an electron donor and an electron acceptor for separation of electrons and holes formed with a nanopattern by the concavo-convex structure of the substrate.

Other aspects and preferred embodiments of the invention are discussed infra.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The above features and advantages of the present invention will be apparent from or are set forth in more detail in the accompanying drawings, which are incorporated in and form a part of this specification, and the following Detailed Description, which together serve to explain by way of example the principles of the present invention.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not imitative of the present invention, and wherein.

Figure 1:
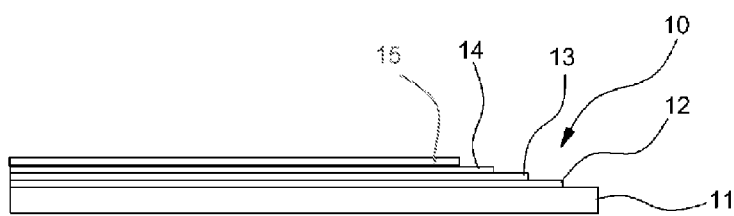
FIG. 1 is a cross-sectional view showing the configuration of an organic thin film solar cell according to a preferred embodiment of the present invention.

Reference numerals set forth in the Drawings includes reference to the following elements as further discussed below:

| 10: solar cell | 11: flexible plastic film substrate |
|---|---|
| 12: bottom electrode layer (transparent electrode layer) | |
| 13: hole transport layer | 14: photoactive layer |
| 15: top electrode layer (metal electrode layer) | |

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

According to preferred aspects, the present invention features a method for manufacturing an organic thin film solar cell by ion beam treatment, the method comprising forming a nanopattern by irradiating an ion beam onto the surface of a flexible plastic film substrate and sequentially stacking a bottom electrode layer, a photoactive layer for photoelectric conversion, and a top electrode layer, which have a nanoscale thickness, on the nanopattern of the substrate such that an electron donor and an electron acceptor in the photoactive layer form a nanopattern, thus forming a bulk heterojunction structure.

In one embodiment, the nanopattern has a concavo-convex structure.

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

According to preferred embodiments, the present invention provides a solar cell, which is configured by stacking organic thin film layers on a flexible plastic film substrate on which a nanopattern having a concavo-convex structure is suitably formed by ion beam irradiation, and a method for manufacturing the same.

According to preferred embodiments of the present invention, a nanopattern is formed on the substrate surface by ion beam irradiation, and a bulk heterojunction structure is formed by the nanopattern. That is, an ion beam process is suitably performed to form a nanoscale concavo-convex pattern by ion beam irradiation on the flexible plastic film substrate. Thereafter, thin film layers with a nanoscale thickness, which constitute the solar cell, are suitably coated on the nanopattern of the substrate such that the electrons and holes generated in a conductive polymer by photon injection are efficiently separated, thus suitably improving energy conversion efficiency.

The present inventors have conducted research to induce the formation of a nanopattern on the electrodes and photoelectric conversion materials by forming a nanopattern on the solar cell substrate itself and, based on the results of the research, the present invention features a new technique of forming a nanopattern by ion beam irradiation on the flexible plastic film substrate.

Accordingly, in a preferred embodiment, the present invention features a nanopattern having a concavo-convex structure that is formed on the surface of the flexible plastic film used as the solar cell substrate in the present invention by ion beam process. Thereafter, a bottom electrode layer, a photoactive layer, in which an electron donor and an electron acceptor are mixed together, a top electrode layer, and a buffer layer suitably interposed between the electrode layer and the photoactive layer, for example, a hole transport layer interposed between the bottom electrode layer and the photoactive layer, are suitably stacked thereon such that the nanopattern is suitably maintained in each layer of the film.

Preferably, when the thin film layers each having a nanoscale thickness such as the electrode layers (bottom electrode/top electrode), the photoactive layer, and the hole transport layer are sequentially stacked on the surface of the flexible film with the nanopattern as the solar cell substrate according to the present invention, each thin film layer stacked on the film substrate also has the nanopattern, and thus the electrons and holes are efficiently separated by the nanopattern formed on the photoactive layer having a bulk heterojunction structure. As a result, it is possible to improve energy conversion efficiency.

According to preferred embodiments of the present invention, the size and thickness of the nanopattern formed on the film substrate may be variously adjusted depending on the intensity of the ion beam, while the thickness of the electrode layers, the photoactive layer, and the hole transport layer may be suitably adjusted depending on the deposition time or the change in concentration of a solution during spin coating, which is the same as conventional methods.

According to certain preferred embodiments and as shown in FIG. 1, for example, FIG. 1 is a cross-sectional view showing the configuration of an organic thin film solar cell according to a preferred embodiment of the present invention. As shown in FIG. 1, the organic thin film solar cell 10 according to a preferred embodiment of the present invention includes a flexible plastic film substrate 11 on which a nanopattern having a concavo-convex structure is formed by ion beam treatment, a bottom electrode layer 12 stacked on the flexible plastic film substrate 11, a photoactive layer 14 stacked on the bottom electrode layer 12 and performing photoelectric conversion, and a top electrode layer 15 stacked on the photoactive layer 14.

According to certain preferred embodiments, the flexible plastic film substrate may be formed of a material selected from the group consisting of polyethylene terephthalate (PET), polyethylene naphthalate (PEN), polycarbonate (PC), polymethylmethacrylate (PMMA), polyvinyl alcohol (PVA), polyacetylcellulose (PAC), polyethylene (PE), polyetheretherketone (PEEK), polyethyleneimine (PEI), polyimide (PI), polyacrylate (PA), polyethersulfone (PES), and cyclic olefin copolymer (COC).

According to certain preferred embodiments, the bottom electrode layer may be a transparent electrode layer as a positive electrode, through which light can penetrate. Preferably, the transparent electrode layer may be formed by stacking a positive electrode material with a high work function such as indium tin oxide (ITO), fluorine-doped tin oxide (FTO), zinc oxide (ZnO), CdSnO4, and the like on the flexible plastic film substrate.

According to certain preferred embodiments, the top electrode layer may preferably be a metal electrode layer as a negative electrode that is preferably formed by stacking a negative electrode material with a low work function such as aluminum (Al) and the like.

According to certain preferred embodiments of the present invention, the photoactive layer is suitably configured to have a bulk heterojunction structure between an electron donor and an electron acceptor for separation of the electrons and holes, and the bulk heterojunction structure is suitably configured to form a nanopattern by the concavo-convex structure of the substrate.

According to certain preferred embodiments, the photoactive layer may be formed by spin coating an aqueous solution prepared by mixing an electron donor and an electron acceptor to form a bulk heterojunction having excellent photoactivity and energy conversion efficiency, in which the electrons and holes are efficiently separated.

According to certain preferred embodiments, the photoactive layer may preferably be formed of [6,6]-phenyl-C61-butyric acid methyl ester (PCBM), poly-3-hexylthiophene (P3HT), and the like by spin coating, inkjet coating, screen printing, pad printing, or roll-to-roll printing.

Accordingly, when the nanoscale thin film layers such as the bottom electrode layer as a positive electrode, the photoactive layer, and the top electrode layer as a negative electrode are stacked on the flexible plastic film substrate with a nanopattern having a concavo-convex structure, each of the nanoscale thin film layers has a nanopattern formed by the concavo-convex structure of the substrate. In particular, since the photoactive layer has a nanopattern, the electrons and holes can be more efficiently separated, and thus it is possible to obtain excellent energy conversion efficiency.

According to further preferred embodiments, the nanostructure can be maintained much longer than a bulk heterojunction structure manufactured by a conventional solution process, thus suitably improving the long-term durability and stability of the organic thin film solar cell.

Further, in the above-described configuration of the solar cell of the present invention, a hole transport layer as a buffer layer may be suitably interposed between the bottom electrode layer formed on the substrate as a positive electrode, i.e., the transparent electrode layer, and the photoactive layer. Further, an electron transport layer as a buffer layer may be suitably interposed between the top electrode layer as a negative electrode layer, i.e., the metal electrode layer, and the photoactive layer.

Preferably, the hole transport layer is a conductive polymer layer, which provides a path through which the holes generated in the photoactive layer move to the bottom electron layer (i.e., transparent electron layer) as a positive electrode. In certain exemplary embodiments, the hole transport layer may be formed of polyethylenedioxythiophene (PEDOT) and poly(styrenesulfonate) (PSS).

In other further exemplary embodiments, the hole transport layer as a conductive polymer layer may be suitably formed by spin coating, inkjet coating, screen printing, pad printing, or roll-to-roll printing.

A method for manufacturing the solar cell according to the present invention is described herein below.

According to a preferred embodiment of the present invention, a nanopattern having a concavo-convex structure is suitably formed by irradiating an ion beam onto the surface of a flexible plastic film substrate, and a bottom electrode layer, a photoactive layer for photoelectric conversion, and a top electrode layer, which have a nanoscale thickness, are sequentially stacked on the nanopattern of the substrate such that an electron donor and an electron acceptor in the photoactive layer, where electrons and holes are suitably separated, form a nanopattern by the concavo-convex structure of the substrate, thus forming a bulk heterojunction structure.

According to certain preferred embodiments, the method for manufacturing the solar cell according to the present invention preferably includes forming a nanopattern having a concavo-convex structure by irradiating an ion beam onto the surface of a flexible plastic film substrate; and forming electrode layers each having a nanostructure and an photoactive layer having a bulk heterojunction structure, which are stacked on the nanopattern of the substrate and having a stacked nanostructure.

An important characteristic of the method for manufacturing solar cell according to preferred embodiments of the present invention is to form the nanopattern having the concavo-convex structure on the surface of the flexible plastic film substrate itself by ion beam irradiation.

Preferably, when the nanopattern is formed on the surface of the substrate in the above manner and the thin film layers, which constitute the solar cell and have a nanostructure, are stacked thereon, it is possible to induce the formation of the nanopattern in each thin film layer.

Accordingly, a nanoscale concavo-convex pattern is suitably formed by irradiating an ion beam onto the flexible plastic thin film substrate and, during this process, the width and height of the concavo-convex structure are suitably controlled in the range of several tens of nanometers. Accordingly, it is possible to induce the formation of a photoactive layer with a nanopattern having a bulk heterojunction structure on the substrate, which suitably increases the photoelectric conversion efficiency and the long-term durability of the solar cell.

In order to form the nanopattern, i.e., the nanoscale concavo-convex pattern, on the substrate, ion beam treatment is performed on the surface of the plastic film substrate by broad ion beam processing under high vacuum conditions.

According to certain preferred embodiments, the ion beam may include at least one selected from the group consisting of argon, nitrogen, oxygen, helium, and a mixture thereof.

Further, the shape of the nanoscale concavo-convex pattern may be suitably adjusted by controlling at least one of irradiation time and accelerating voltage of the ion beam. Preferably, the pressure of a chamber for forming the pattern by the ion beam treatment is in the range of $1.0 \times 10^{-7}$ to $2.75 \times 10^{-3}$ Pa, and the irradiation time of the ion beam is in the range of 1 to 180 min. According to further preferred embodiments, during the ion beam treatment, the magnitude of the accelerating voltage of the focused ion beam is adjusted in the range of 100 eV to 100 keV. Further, the incidence angle of the ion beam with respect to the surface may be 0° to 90°, although the ion beam was incident perpendicular to the surface in the following examples.

According to certain preferred embodiments, when the irradiation time of the ion beam is less than 1 min., the nanopattern may not be suitably formed, whereas, when the irradiation time of the ion beam is more than 180 min., the chemical structure of the substrate may be suitably transformed by ion beam energy, which reduces the physical properties of the substrate.

Further, when the magnitude of the accelerating voltage as the intensity of the ion beam is smaller than 100 eV, the nanopattern may not be suitably formed, whereas, when the magnitude of the accelerating voltage is greater than 100 keV, the chemical structure of the substrate may be suitably transformed by ion beam energy, which reduces the physical properties of the substrate.

Accordingly, after the nanopattern having a concavo-convex structure is suitably formed by the ion beam treatment of the plastic film substrate, the thin film layers each having a nanoscale thickness such as the transparent electrode layer, the photoactive layer, and the top electrode layer are sequentially stacked on the nanopattern of the substrate and, if necessary, a hole transport layer as a conductive polymer layer may be further interposed between the transparent electrode layer and the photoactive layer.

The present invention will be described in more detail with reference to the following examples. However, the following examples are given merely as illustrative of the present invention and not intended to limit the present invention.

Example

Figure 2:
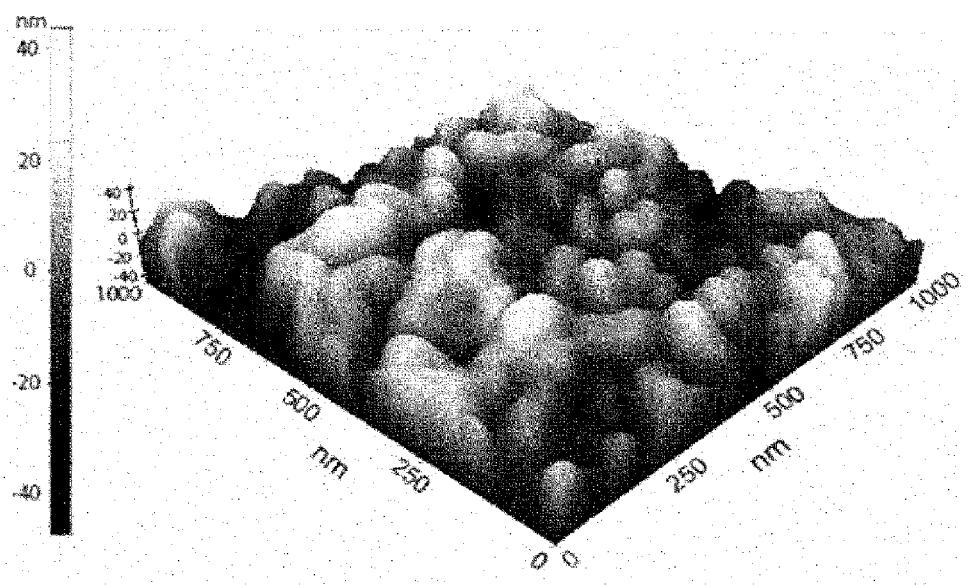
FIGS. 2 and 3 are an atomic force microscope (AFM) image and a scanning electron microscope (SEM) image showing a nanopattern having a concavo-convex structure formed on the surface of a film used as a substrate according to a preferred embodiment of the present invention.
Figure 3:
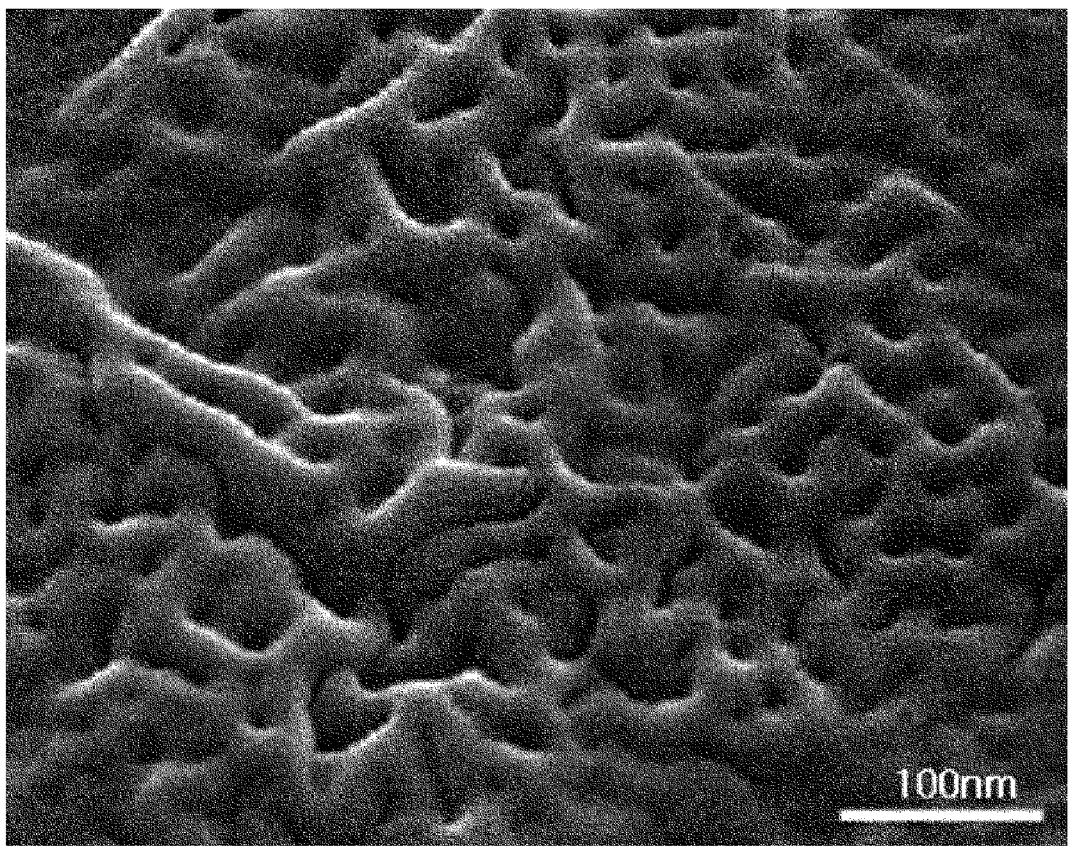

In this Example of the present invention, a transparent polyethylene terephthalate (PET) film (manufactured by SKC) was used as a flexible plastic film substrate, and the PET film was suitably fixed to an ion beam irradiating apparatus such that the ion beam was incident perpendicular to the surface of the film. Further, argon (Ar+) ion beam treatment was suitably performed to form a nanopattern on the PET film having a smooth surface. Here, the Ar+ ion beam treatment was suitably performed under the conditions that the voltage between a cathode and an anode of an ion gun was 1,000 eV for 30 minutes. Preferably, the degree of vacuum in a vacuum chamber was less than 0.01 mTorr. According to certain preferred embodiments and as shown in FIGS. 2 and 3, for example, FIGS. 2 and 3 are an atomic force microscope (AFM) image and a scanning electron microscope (SEM) image showing the nanopattern having a concavo-convex structure formed on the surface of the film in the above manner. Further, an indium tin oxide (ITO) layer as a transparent electrode layer having a thickness of about 20 nanometers was formed on the film with the nanopattern having a concavo-convex structure. Subsequently, an aqueous solution (0.8 wt % PEDOT-PSS solution), in which conductive polymers, PEDOT and PSS, were mixed together, was spin-coated at 5,000 rpm on the surface of the ITO layer to form a hole transport layer. In further preferred embodiments, after the resulting film was dried in the air at 150° C., 15 mg of poly-3-hexylthiolphene (P3HT) and 7.5 mg of [6,6]-phenyl-C61-butyric acid methyl ester (PCBM) were mixed with 1 mg of chlorobenzene, and the mixed solution was spin-coated at 5,000 rpm to form a photoactive layer. After the resulting film was dried at 120° C. for 10 minutes under nitrogen atmosphere, aluminum (Al) was vapor-deposited on the photoactive layer to form a metal electrode layer.

Comparative Example

A solar cell was manufactured using an ordinary PET film as a substrate. Here, an ITO layer as a transparent electrode layer having a thickness of about 20 nanometers was formed on the PET film. Subsequently, an aqueous solution (0.8 wt % PEDOT-PSS solution), in which conductive polymers, PEDOT and PSS, were mixed together, was spin-coated at 4,000 rpm on the surface of the ITO layer to form a hole transport layer. Then, after the resulting film was dried in an oven at 60° C., 15 mg of poly-3-hexylthiolphene (P3HT) and 7.5 mg of [6,6]-phenyl-C61-butyric acid methyl ester (PCBM) were mixed with 1 mg of chlorobenzene, and the mixed solution was spin-coated at 4,000 rpm on the hole transport layer to form a photoactive layer. After the resulting film was dried at 120° C. for 10 minutes under nitrogen atmosphere, aluminum (Al) was vapor-deposited on the photoactive layer to form a metal electrode layer.

Then, an ITO layer as a transparent electrode layer having a thickness of about 20 nanometers was formed on the resulting film with the nanopattern having a concavo-convex structure, and an aqueous solution (0.8 wt % PEDOT-PSS solution), in which conductive polymers, PEDOT and PSS, were mixed together, was spin-coated at 5,000 rpm on the surface of the ITO layer to form a hole transport layer.

The following table 1 shows the current density (Jsc), the open-circuit voltage (Voc), the fill factor (FF), and the energy conversion efficiency of the solar cells manufactured according to the Example and the Comparative Example. It can be seen that the energy conversion efficiency of the solar cell having the nanopattern according to the Example was higher (1.91%) than that (1.50%) of the solar cell having no nanopattern according to the Comparative Example. This indicates that the electrons and holes generated by the nanopattern were efficiently separated.

TABLE 1

| Classification | Current density (Jsc) | Open-circuit voltage (Voc) | Fill factor (FF) | Energy conversion efficiency (%) |
|---|---|---|---|---|
| Example | 5.76 | 0.648 | 0.512 | 1.91 |
| Comparative Example | 4.01 | 0.611 | 0.612 | 1.5 |

As described above, the organic thin film solar cell according to the present invention is manufactured by forming a nanopattern on the surface of a flexible film used as a solar cell substrate by an ion beam process, and stacking an electrode layer, a photoactive layer, in which an electron donor and an electron acceptor are mixed together, and a hole transport layer interposed between the electrode layer and the photoactive layer on the nanopattern. Accordingly, since the organic thin film solar cell according to the present invention is manufactured by forming a nanopattern on the substrate itself by the ion beam process, instead of a semiconductor process such as an etching process, an lithography process, and the like, which require expensive equipment, it is possible to suitably simplify the manufacturing process and suitably reduce the manufacturing cost.

Moreover, since the nanopattern is suitably formed on the solar cell substrate itself by the ion beam process to form a nanopattern on the electrodes and the photoelectric conversion materials, which are stacked on the substrate, it is possible to suitably maintain the nanostructure much longer than a bulk heterojunction structure manufactured by a conventional solution process, thus improving the long-term stability of the organic thin film solar cell.

Furthermore, according to preferred embodiments of the present invention, it is possible to efficiently transfer a considerable amount of photo charges generated by the bulk heterojunction structure each electrode, and thus it is possible to suitably improve the energy conversion efficiency.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A method for manufacturing an organic thin film solar cell by ion beam treatment, the method comprising:
    forming a nanopattern having a concavo-convex structure by irradiating an ion beam onto the surface of a flexible plastic film substrate; and
    sequentially stacking a bottom electrode layer, a photoactive layer for photoelectric conversion, and a top electrode layer, which have a nanoscale thickness, on the nanopattern of the substrate such that an electron donor and an electron acceptor in the photoactive layer, where electrons and holes are separated, form a nanopattern by the concavo-convex structure of the substrate, thus forming a bulk heterojunction structure.

2. The method of claim 1, wherein the substrate is formed of a material selected from the group consisting of polyethylene terephthalate (PET), polyethylene naphthalate (PEN), polycarbonate (PC), polymethylmethacrylate (PMMA), polyvinyl alcohol (PVA), polyacetylcellulose (PAC), polyethylene (PE), polyetheretherketone (PEEK), polyethyleneimine (PEI), polyimide (PI), polyacrylate (PA), polyethersulfone (PES), and cyclic olefin copolymer (COC).

3. The method of claim 1, wherein the intensity of the ion beam is set by adjusting the magnitude of accelerating voltage of focused ion beam in the range of 100 eV to 100 keV.

4. The method of claim 1, wherein the ion beam irradiation time is in the range of 1 to 180 min.

5. The method of claim 1, wherein the ion beam comprises at least one selected from the group consisting of argon, nitrogen, oxygen, helium, and a mixture thereof.

6. The method of claim 1, wherein the photoactive layer is formed by spin coating, inkjet coating, screen printing, pad printing, or roll-to-roll printing.

7. The method of claim 1, wherein the bottom electrode layer is a transparent electrode layer as a positive electrode, the top electrode layer is a metal electrode layer as a negative electrode, and a hole transport layer formed of a conductive polymer is interposed between the transparent electrode layer and the photoactive layer.

8. The method of claim 7, wherein the hole transport layer is formed by spin coating, inkjet coating, screen printing, pad printing, or roll-to-roll printing.

9. An organic thin film solar cell manufactured by claim 1, the organic thin film solar cell comprising:
    a flexible plastic film substrate including a nanopattern having a concavo-convex structure and formed on the surface thereof;
    a top electrode and a bottom electrode, stacked on the top of the substrate; and
    a photoactive layer interposed between the top electrode and the bottom electrode and including a bulk heterojunction structure between an electron donor and an electron acceptor for separation of electrons and holes formed with a nanopattern by the concavo-convex structure of the substrate.

10. The organic thin film solar cell of the claim 9, wherein the substrate is formed of a material selected from the group consisting of consisting of polyethylene terephthalate (PET), polyethylene naphthalate (PEN), polycarbonate (PC), polymethylmethacrylate (PMMA), polyvinyl alcohol (PVA), polyacetylcellulose (PAC), polyethylene (PE), polyetheretherketone (PEEK), polyethyleneimine (PEI), polyimide (PI), polyacrylate (PA), polyethersulfone (PES), and cyclic olefin copolymer (COC).

11. The method of claim 9, wherein the bottom electrode layer is a transparent electrode layer as a positive electrode, the top electrode layer is a metal electrode layer as a negative electrode, and a hole transport layer formed of a conductive polymer is interposed between the transparent electrode layer and the photoactive layer.

12. A method for manufacturing an organic thin film solar cell by ion beam treatment, the method comprising:
    forming a nanopattern by irradiating an ion beam onto the surface of a flexible plastic film substrate; and
    sequentially stacking a bottom electrode layer, a photoactive layer for photoelectric conversion, and a top electrode layer, which have a nanoscale thickness, on the nanopattern of the substrate such that an electron donor and an electron acceptor in the photoactive layer form a nanopattern, thus forming a bulk heterojunction structure.

13. The method of claim 12, wherein the nanopattern has a concavo-convex structure.

14. The method of claim 1, wherein the nanopattern formed on the surface of the flexible plastic film substrate is maintained in each of the sequentially stacked bottom electrode layer, photoactive layer and top electrode layer.

15. The method of claim 12, wherein the nanopattern formed on the surface of the flexible plastic film substrate is maintained in each of the sequentially stacked bottom electrode layer, photoactive layer and top electrode layer.

* * * * *